(12) United States Patent
Zohner et al.

(10) Patent No.: US 8,552,780 B2
(45) Date of Patent: Oct. 8, 2013

(54) METHOD AND APPARATUS FOR DETERMINING DUTY CYCLE OF A CLOCK IN A CIRCUIT USING A CONFIGURABLE PHASE LOCKED LOOP

(75) Inventors: Thayl D. Zohner, Naperville, IL (US); Douglas A. Chandler, Aurora, IL (US); Jae-Hu Kim, Naperville, IL (US)

(73) Assignee: Tellabs Operations, Inc., Naperville, IL (US)

( * ) Notice: Subject to any disclaimer, the term of this patent is extended or adjusted under 35 U.S.C. 154(b) by 112 days.

(21) Appl. No.: 13/269,678

(22) Filed: Oct. 10, 2011

(65) Prior Publication Data
US 2013/0088270 A1    Apr. 11, 2013

(51) Int. Cl.
*H03H 11/16*    (2006.01)
(52) U.S. Cl.
USPC .......................................... 327/231; 327/175

(58) Field of Classification Search
None
See application file for complete search history.

(56) References Cited

U.S. PATENT DOCUMENTS

2008/0164927 A1*   7/2008   Wang ............................ 327/254

\* cited by examiner

*Primary Examiner* — Cassandra Cox
(74) *Attorney, Agent, or Firm* — Fitzpatrick, Cella, Harper & Scinto

(57) ABSTRACT

An embodiment of the invention discloses phase shifting a second clock signal by a phase increment with respect to a first clock signal, where the first clock signal and the second clock signal have the same periods. The first clock signal is sampled with the second clock signal, and the output of the sample indicates whether the sample of the first clock signal is at a logic one state or a logic zero state. A count of logic one samples is incremented if the sample of the first clock signal is at a logic one state. The process of phase shifting the second clock signal and sampling the first clock signal is repetitively performed to a maximum number of samples.

22 Claims, 5 Drawing Sheets

METHOD AND APPARATUS FOR DETERMINING DUTY CYCLE OF A CLOCK IN A CIRCUIT USING A CONFIGURABLE PHASE LOCKED LOOP

BACKGROUND

1. Field

Example aspects described herein relate to determining a clock duty cycle, and more specifically for determining the duty cycle of a clock in a circuit using a configurable phase locked loop.

2. Description of Related Art

Duty cycle of a clock can be important in various circuits. For example, if digital logic is clocked on rising and falling edges of a clock, then it may be necessary to have a substantially 50-50 duty cycle. A very skewed duty cycle may not provide enough time for digital calculations before the next edge of the clock.

A common approach to measuring duty cycle of a clock is to either measure the clock with an oscilloscope or with an advanced frequency counter. Both these approaches require relatively expensive test equipment and a fair amount of labor to find the correct pin, attach or hold the probe to the pin, and analyze the data to determine if it is within limits.

SUMMARY

Existing limitations associated with the foregoing, and other limitations, can be overcome by procedures, apparatuses, computer programs, and networks, according to example aspects described herein.

In one example embodiment herein, a procedure is provided for phase shifting a second clock signal by a phase increment with respect to a first clock signal, where the first clock signal and the second clock signal have the same periods. The first clock signal is sampled with the second clock signal, and the output of the sample indicates whether the sample of the first clock signal is at a logic one state or a logic zero state. A count of logic one samples is incremented if the sample of the first clock signal is at a logic one state. The process of phase shifting the second clock signal and sampling the first clock signal is repetitively performed to a maximum number of samples.

Another example embodiment discloses a phase shifting circuitry configured to phase shift a second clock signal by a phase increment with respect to a first clock signal, where the first clock signal and the second clock signal have the same periods. A sampling circuitry may be configured to sample the first clock signal with the second clock signal, where the output of the sampling circuitry indicates whether the sample of the second clock signal is at a logic one state or a logic zero state. A counting circuitry may also be configured to increment a count of logic one samples if the sample of the first clock signal is at a logic one state. The process of phase shifting and sampling may be performed repetitively until a condition is detected to stop the process. The counting of logic one samples by the counting circuitry may be performed while the process of phase shifting and sampling takes place. The phase shifting circuitry, the sampling circuitry, and/or the counting circuitry may be controlled by a control circuitry.

Another example embodiment discloses adjusting a phase of a second clock signal by a phase increment with respect to a first clock signal, where the first clock signal and the second clock signal have the same periods. The first clock signal may be sampled with the second clock signal, where the second clock signal is derived from the first clock signal and has the same period as the first clock signal. A determination may be made whether a sample of the first clock signal is a logic one or a logic zero, and a counter may update a count of logic one samples if the sample is at a logic one state. There may also be a determination of whether the phase of the second clock signal has been adjusted a maximum number of times. The process of adjusting the phase of the second clock signal and sampling the first clock signal may repeat if the phase of the second clock signal has not been adjusted a maximum number of times.

BRIEF DESCRIPTION OF THE DRAWINGS

The teachings claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

DETAILED DESCRIPTION

According to an example aspect herein, a procedure, a system, an apparatus, and/or a computer program may be provided that illustrate a duty cycle calculator.

Figure 1:
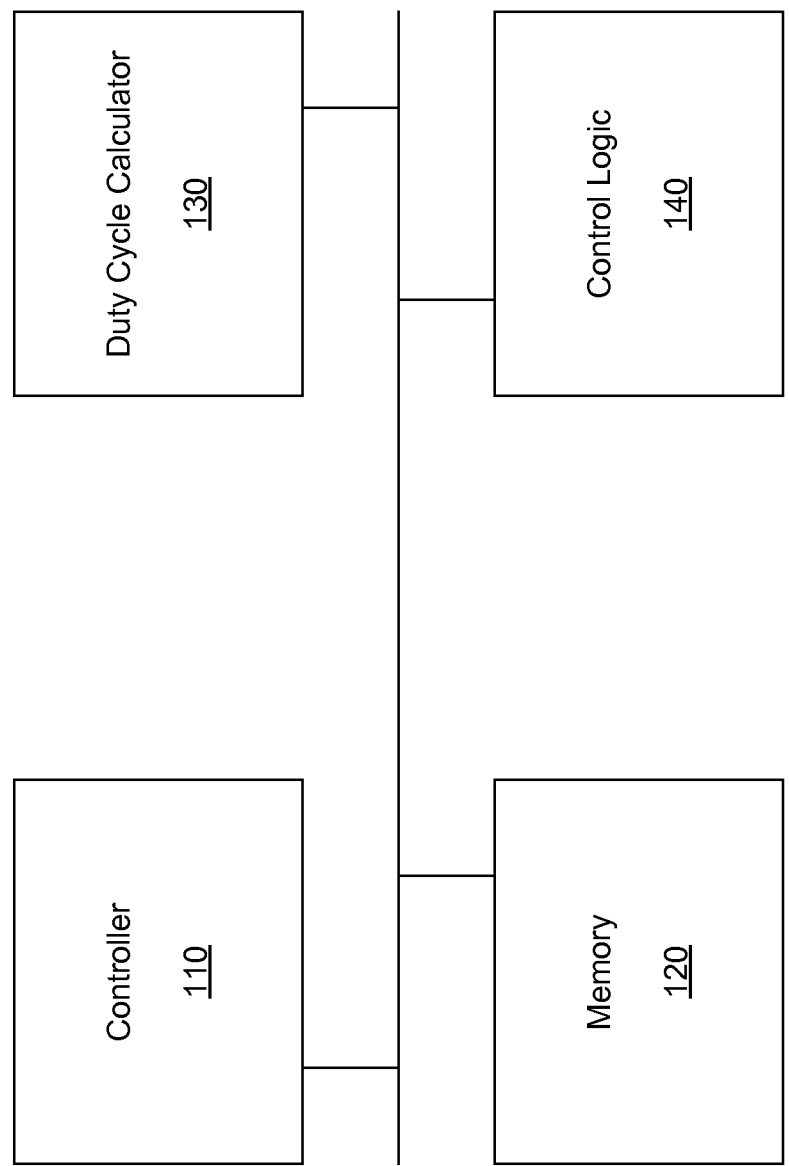
FIG. 1 is a block diagram of a system using a duty cycle calculator in accordance with an embodiment of the invention.

An example embodiment of a duty cycle calculator will be described with respect to FIGS. 1 to 3. Referring to FIG. 1, there is shown a block diagram of a system using a duty cycle calculator in accordance with an embodiment of the invention. In FIG. 1, there are shown a controller 110, a memory block 120, a duty cycle controller 130, and control logic block 140.

The controller 110 may comprise, for example, a processor and internal memory. The controller 110 may alternately comprise, for example, a processor used in conjunction with the memory block 120. The memory block 120 may comprise, for example, volatile memory for usage during operation of the controller 110 and non-volatile memory for storing software and data that may be used by the controller 110 to execute various commands. The duty cycle calculator 130 may comprise logic that may be used to calculate duty cycle for a clock signal. The control logic block 140 may comprise logic that may be used to generate various control and/or status signals used by the controller 110, the memory block 120, and/or the duty cycle calculator 130.

While FIG. 1 has been described as discrete blocks performing different functions, the invention need not be so limited. For example, the control logic 140 may be part of the duty cycle calculator 130. Additionally, the controller 110 may be configured to generate various control and or status signals for use by the memory block 120 and/or the duty cycle calculator 130.

Figure 2:
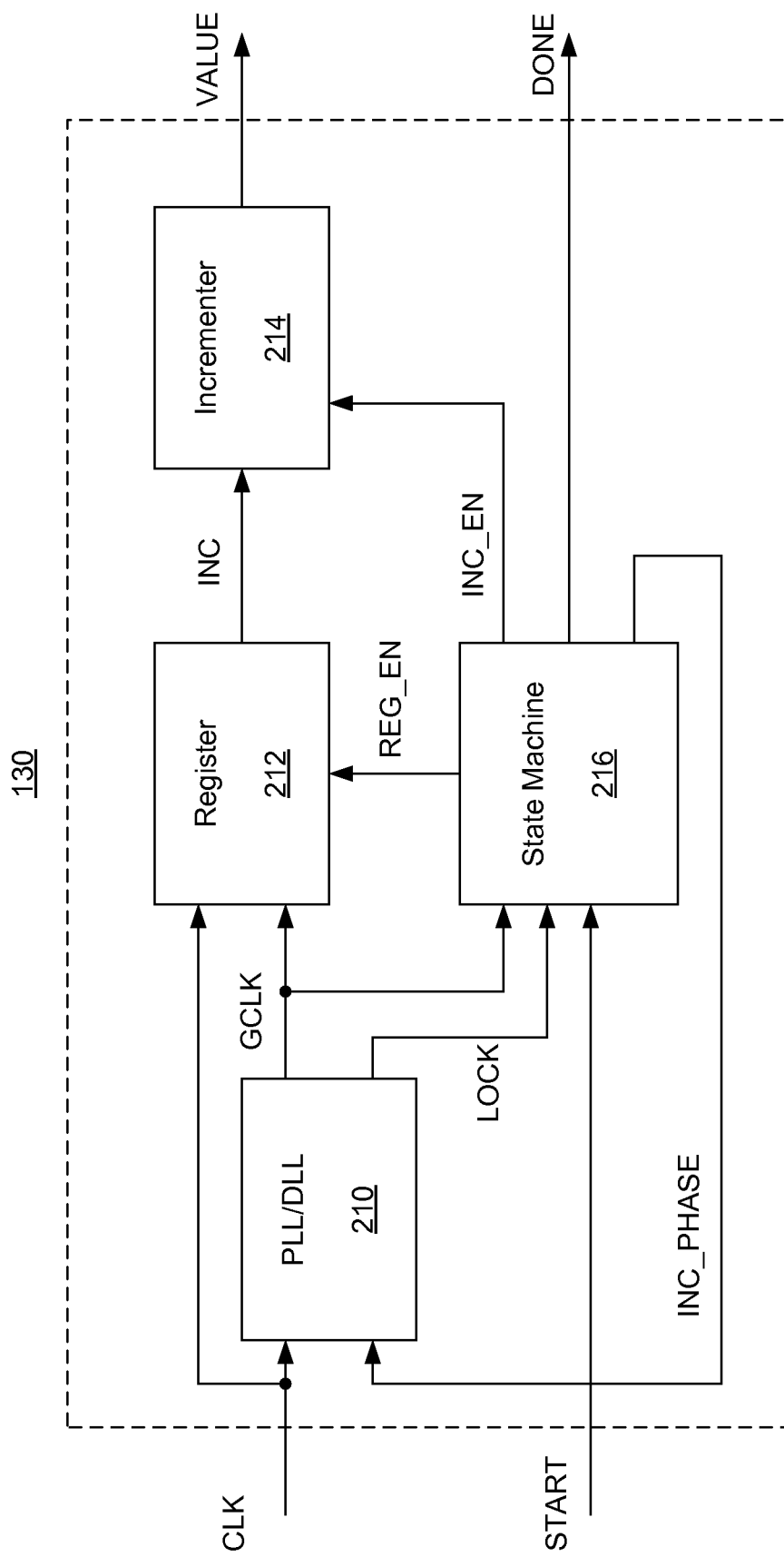
FIG. 2 is a block diagram illustrating a duty cycle calculator in accordance with an embodiment of the invention.

Referring to FIG. 2, there is shown a block diagram illustrating a duty cycle calculator in accordance with an embodiment of the invention. There is shown in FIG. 2 the duty cycle calculator 130. The duty cycle calculator 130 comprises a phase locked loop (PLL) 210, a register 212, an incrementer 214, and a state machine 216.

In operation, an input clock signal CLK may be communicated to the PLL 210 and the register 212. The input clock signal CLK may be, for example, a clock signal used by the controller 110, the memory 120, and the control logic 140. A phase-adjusted clock signal GCLK may be derived, for example, from the input clock signal CLK, where the phase-adjusted clock signal GCLK and the input clock signal CLK have the same period. The state machine 216, upon receiving a start signal START, may generate a phase shift signal INC_PHASE. The start signal START may be generated by, for example, the controller 110 or the control logic 140. The phase shift signal INC_PHASE may be used by the PLL 210 to increase a phase of the phase-adjusted clock signal GCLK by a pre-determined phase increment. The PLL 210 may then output a phase-adjusted clock signal GCLK with the same period as the input clock signal CLK. The difference between the input clock signal CLK and the phase-adjusted clock signal GCLK may generally be the phase.

The PLL 210 may be configured to assert a phase locked signal LOCK upon a successful lock of the phase-adjusted clock signal GCLK to the input clock signal CLK. The phase locked signal LOCK, which indicates the phase is now stable, can then be used by the state machine 216 to generate a register enable signal REG_EN. The register enable signal REG_EN may enable the register 212 to generate an increment signal INC when a rising edge of the phase-adjusted clock signal GCLK occurs during a high phase of the input clock signal CLK. The high phase of a clock may be defined as the period of time when the clock is at a high voltage level, which may be referred to as a logic one state in an active high logic design. Similarly, a low voltage level may be referred to as a logic zero state in an active high logic design. Alternatively, active low logic design may refer to a low voltage level as a logic one state and a high voltage level as a logic zero state.

The increment signal INC is communicated to the incrementer 214. When the incrementer 214, which may be, for example, an up-counter, receives the increment signal INC while the state machine 216 asserts the increment enable signal INC_EN, the incrementer 214 will increment a count. The count may be output as output count VALUE. The state machine 216 will iterate until the PLL 210 has cycled through a period of the input clock signal CLK an incremental phase change at a time. Since the phase shifts are a specific number of degrees per shift, it is known how many phase shifts equal one clock period, or 360 degrees. Accordingly, the state machine 214 knows how many phase shift signal INC_PHASE needs to be generated. The state machine 216 will then output a count finished signal DONE, which may indicate to the controller 110 to read the output count VALUE. Note that the incrementer 214 needs to be reset to zero before the duty cycle calculator 130 can perform another duty cycle calculation.

The controller 110 may then be able to calculate the duty cycle of the input clock signal CLK. For example, if there are 200 phase increments in a clock period, and the incrementer 214 has an output count VALUE of 108, then the duty cycle may be calculated as 54%. The equation can be described as the output count VALUE divided by the number of phase increments in a clock period times 100%.

While one specific embodiment of the invention has been described with respect to FIG. 2, the invention need not be so limited. For example, use of the phase shift signal INC_PHASE may be design dependent. The phase shift signal INC_PHASE may indicate to the PLL 210 that phase should be adjusted by a constant amount. There may also need to be a reset signal (not shown) to indicate to the PLL 210 to reset the accumulated phase to zero. The phase shift signal INC_PHASE may also communicate to the PLL 210 the absolute amount of phase to be shifted. As can be seen, various designs may be used to control the phase shift of the phase-adjusted clock signal GCLK.

Similarly, a specific implementation of an embodiment of the invention may be design dependent. For example, the PLL 210 may be replaced by a digital delay locked loop (DLL) 210. Also, as an example, the duty cycle calculator 130 may be a part of the control logic 140.

Figure 3:
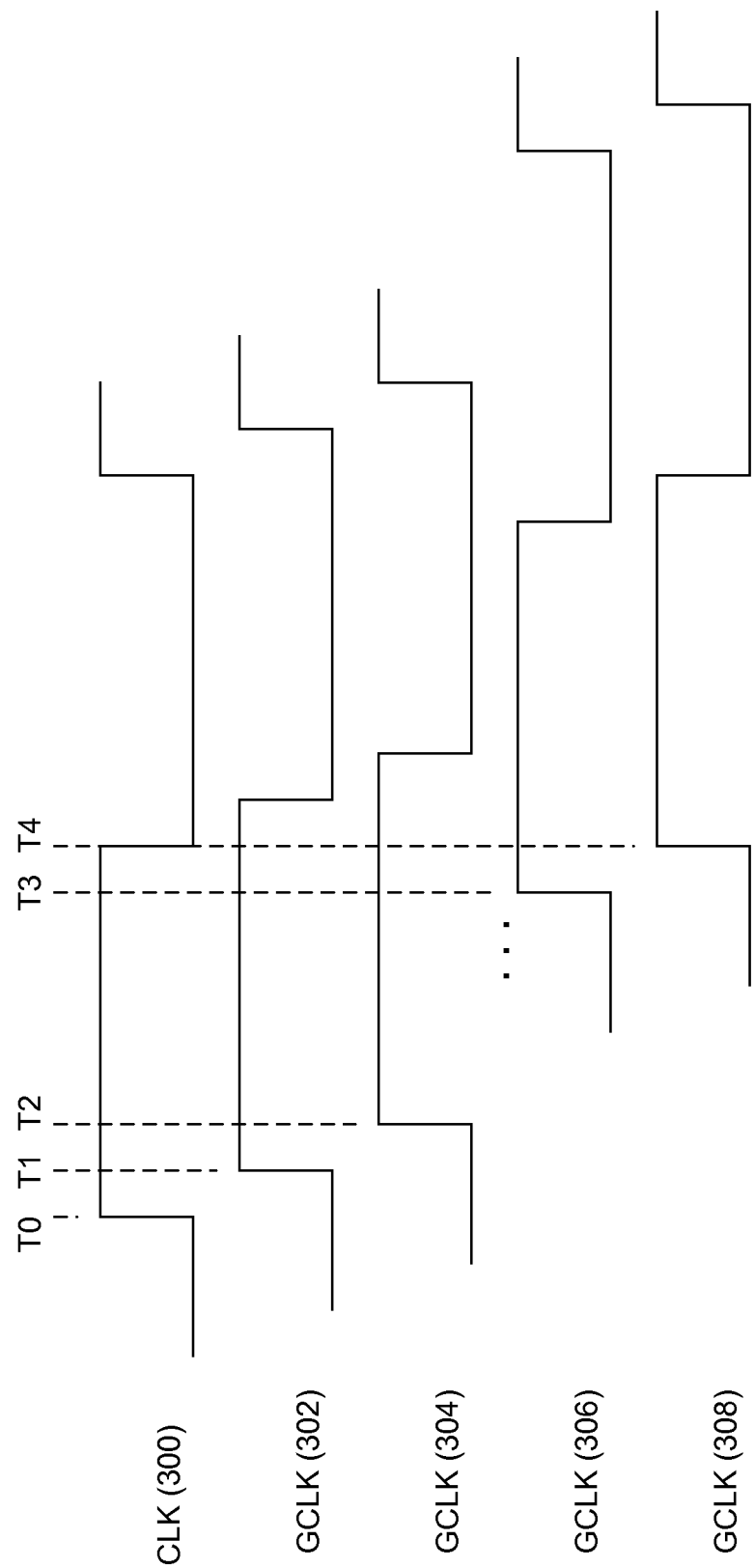
FIG. 3 is an exemplary timing diagram illustrating phase shift of phase-shifted clock GCLK in accordance with an embodiment of the invention.

FIG. 3 is an exemplary timing diagram illustrating phase shift of phase-shifted clock GCLK in accordance with an embodiment of the invention. Referring to FIG. 3, there is shown the input clock signal CLK 300 and various phases of the phase-adjusted clock signal GCLK 302-308.

After reception of the start signal START, the state machine 216 may generate the phase shift signal INC_PHASE. The PLL 210 may then lock to generate the phase-adjusted clock signal GCLK 302 that has a phase difference of one phase increment with respect to the input clock signal CLK. The phase difference may be seen between the rising edge at time T0 of the input clock signal CLK 300 and the rising edge at time T1 of the phase-adjusted clock signal GCLK 302.

Upon reception of a second phase shift signal INC_PHASE, the PLL 210 may lock to generate the phase-adjusted clock signal GCLK 304 that has a phase difference of two phase increments with respect to the input clock signal CLK. The phase difference may be seen between the rising edge at time T0 of the input clock signal CLK 300 and the rising edge at time T2 of the phase-adjusted clock signal GCLK 304. Similarly, the phase-adjusted clock signal GCLKs 306 and 308 show further phase adjustments.

Note that the last phase-adjusted clock signal GCLK 308 may not be able to sample the input clock signal CLK signal accurately depending on the set-up and hold times available with respect to the rising edge at time T4. Generally, the number of phase increments may be chosen so that this uncertainty is within an acceptable error range. The method of error compensation used, if any, is design dependent.

Figure 4:
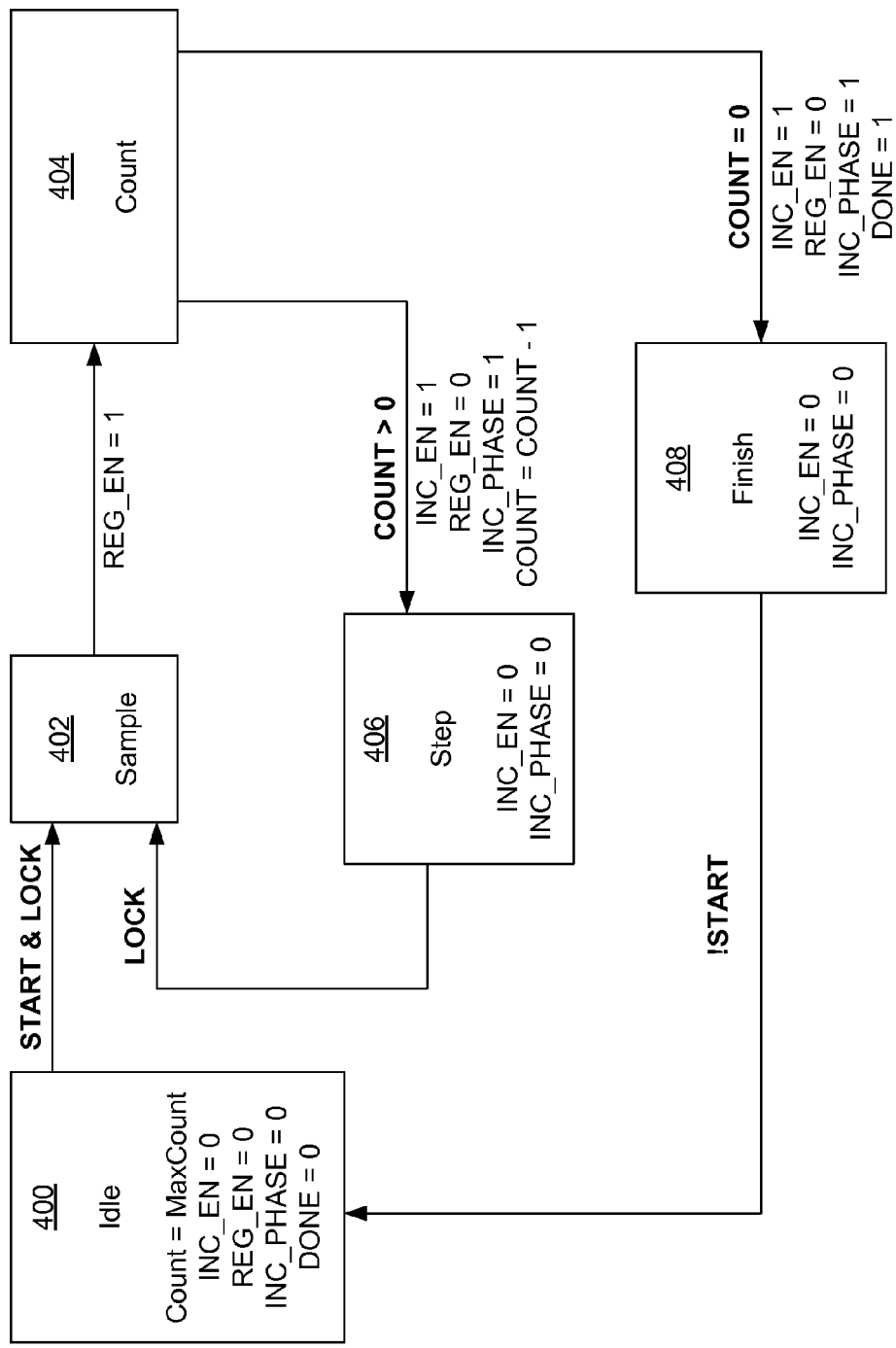
FIG. 4 is an exemplary state diagram for a duty cycle calculator in accordance with an embodiment of the invention.

FIG. 4 is an exemplary state diagram for a duty cycle calculator in accordance with an embodiment of the invention. Referring to FIG. 4, an initial Idle state 400 may have a variable Count set to MaxCount, where MaxCount is the number of phase increments in a clock period. The increment enable signal INC_EN, the register enable signal REG_EN, the phase shift signal INC_PHASE, and the count finished signal DONE are all be cleared to '0' in the Idle state 400. Signal names used for state transition are shown bolded above a transition line.

During the Idle state 400, the start signal START may be received from, for example, the controller 110. When the PLL 210 has appropriately phase locked the phase-adjusted clock signal GCLK to the input clock signal CLK, the phase locked signal LOCK may be asserted. The reception of the start signal START and the phase locked signal LOCK may allow transition to the Sample 402. The Sample state 402 may then transition to a Count state 404, and the register enable signal REG_EN may be asserted to allow the register 212 to sample the input clock signal CLK with the phase-adjusted clock signal GCLK.

During the Count state 404, the variable Count is checked to see if it is equal to zero. If the variable Count is equal to zero, then there is a transition to a Finish state 408. During the transition, the increment enable signal INC_EN is set to a '1', the register enable signal REG_EN is cleared to '0', the phase shift signal INC_PHASE is set to a '1', and the count finished signal DONE is set to a '1'. The enable signal INC_EN and the phase shift signal INC_PHASE are cleared to '0' in the Finish state 408.

If the variable count is not equal to zero, then there is a transition to a Step state 406. In the transition, the increment enable signal INC_EN is set to a '1', the register enable signal REG_EN is cleared to '0', the phase shift signal INC_PHASE is set to a '1', and the variable Count is decremented by one. The enable signal INC_EN and the phase shift signal INC_PHASE are cleared to '0' in the Step state 406.

From the step state 406, the next transition may be to the Sample state 402 if the phase locked signal LOCK is asserted. From the Finish state 408, the next transition is to the Idle state 400 when the start signal START is deasserted.

Figure 5:
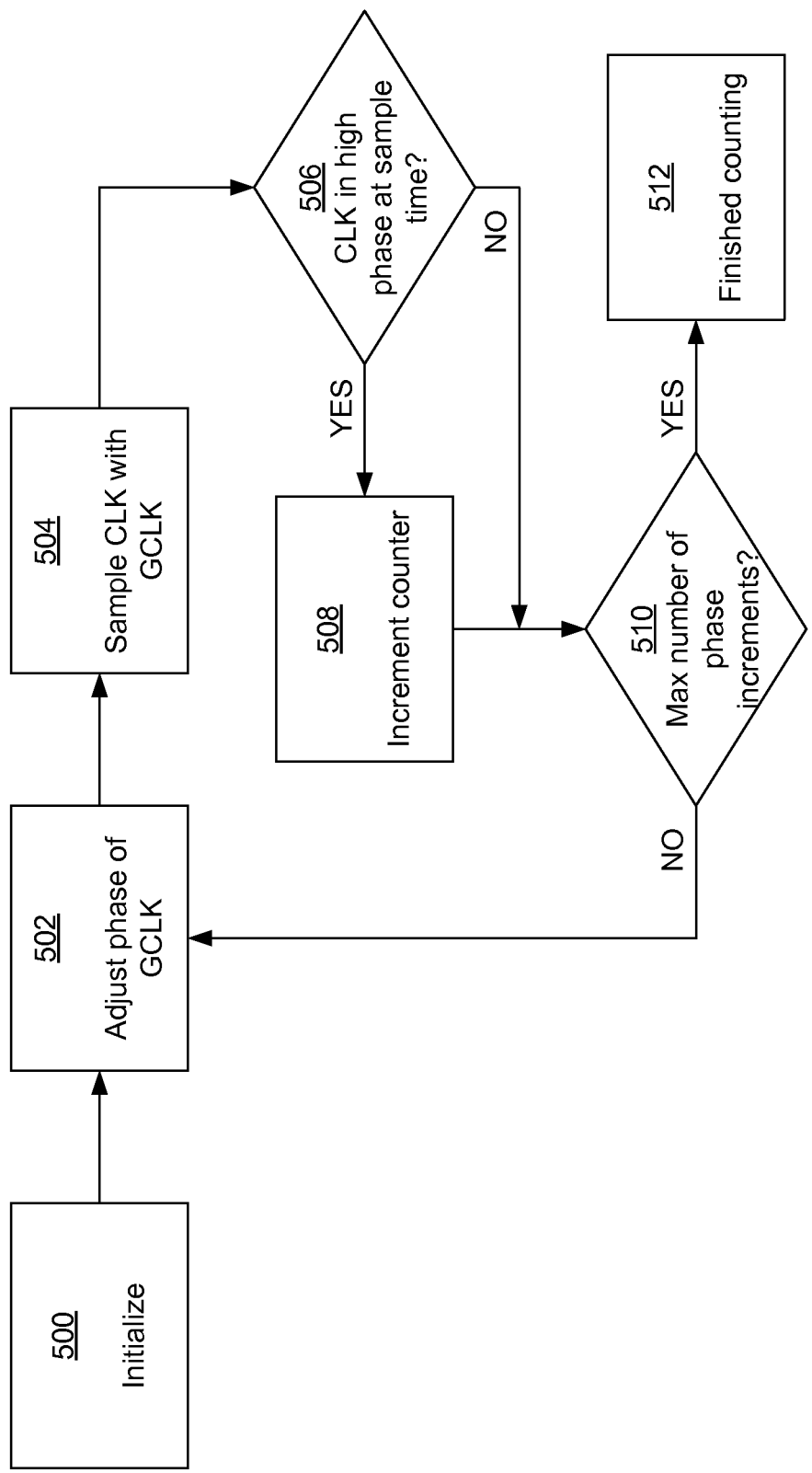
FIG. 5 is an exemplary flow diagram for an embodiment of the invention for calculating duty cycle of a clock signal.

FIG. 5 is an exemplary flow diagram for an embodiment of the invention for calculating duty cycle of a clock signal. Block 500 indicates that the duty cycle calculator 130 may be initialized to be in a state to start a new duty cycle calculation. This may happen, for example, due to power on reset, a command from the controller 110, or completion of a duty cycle calculation. Starting duty cycle calculation may be initiated by the start signal START from, for example, the controller 110.

Block 502 indicates that the phase of the phase-shifted clock signal GCLK may be shifted by one phase increment by the PLL 210 with respect to the previous phase difference between the phase-shifted clock signal GCLK and the input clock signal CLK. If this is the start of a new duty cycle, then the previous phase difference with the input clock signal CLK is zero.

Block 504 indicates that when the PLL 210 has locked the phase-shifted clock signal GCLK to the input clock signal CLK, the register 212 may sample the input clock signal CLK with the phase-shifted clock signal GCLK. If, as indicated in block 506, the sample is at a high phase of the input clock signal CLK, a counter is incremented as shown in block 508. Block 510 indicates that the counter is checked to see if the phase-shifted clock signal GCLK has been shifted by a maximum number of phase increments. If so, then the duty cycle calculator has finished sampling the input clock signal CLK with the phase-shifted clock signal GCLK and outputs the count finished signal DONE.

If in block 510 it is determined that the phase-shifted clock signal GCLK has not been shifted by a maximum number of phase increments, then further sampling of the input clock signal CLK is needed. Accordingly, the phase-shifted clock signal GCLK is shifted by one phase increment by the PLL 210 as indicated by block 502.

If, as indicated in block 506, the sample is not at a high phase of the input clock signal CLK, then the counter is not incremented and, as indicated in block 510, a check is done to see if the phase-shifted clock signal GCLK has been shifted by a maximum number of phase increments.

In the foregoing description, example aspects of the invention are described with reference to specific example embodiments thereof. The specification and drawings are accordingly to be regarded in an illustrative rather than in a restrictive sense. It will, however, be evident that various modifications and changes may be made thereto, in a computer program product or software, hardware, or any combination thereof, without departing from the broader spirit and scope of the present invention.

Software embodiments of example aspects described herein may be provided as a computer program product, or software, that may include an article of manufacture on a machine accessible or machine readable medium (memory) having instructions. The instructions on the machine accessible or machine readable medium may be used to program a computer system or other electronic device. The machine-readable medium may include, but is not limited to, floppy diskettes, optical disks, CD-ROMs, and magneto-optical disks or other types of media/machine-readable medium suitable for storing or transmitting electronic instructions. The techniques described herein are not limited to any particular software configuration. They may find applicability in any computing or processing environment. The terms "machine accessible medium", "machine readable medium", or "memory" used herein shall include any medium that is capable of storing, encoding, or transmitting a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result. In other embodiments, functions performed by software can instead be performed by hardcoded modules, and thus the invention is not limited only for use with stored software programs. Indeed, the numbered parts of the above-identified procedures represented in the drawings may be representative of operations performed by one or more respective modules, wherein each module may include software, hardware, or a combination thereof.

In addition, it should be understood that the figures illustrated in the attachments, which highlight the functionality and advantages of the present invention, are presented for example purposes only. The architecture of the example aspect of the present invention is sufficiently flexible and configurable, such that it may be utilized (and navigated) in ways other than that shown in the accompanying figures.

In addition, it is not necessary that the procedures performed by the analysts be done with a computer, and instead they can be performed by a human operator.

Although example aspects of this invention have been described in certain specific embodiments, many additional modifications and variations would be apparent to those skilled in the art. It is therefore to be understood that this invention may be practiced otherwise than as specifically described. Thus, the present example embodiments, again, should be considered in all respects as illustrative and not restrictive.

What is claimed:

1. A method comprising:
   phase shifting a second clock signal by a phase increment with respect to a first clock signal, wherein the first clock signal and the second clock signal have the same periods;
   sampling the first clock signal with the second clock signal, wherein the output of the sample indicates whether the sample of the first clock signal is at a logic one state or a logic zero state;
   incrementing a count of logic one samples if the sample of the first clock signal is at a logic one state; and
   repetitively performing the process of phase shifting the second clock signal and sampling the first clock signal.

2. The method of claim 1, wherein the second clock signal is derived from the first clock signal.

3. The method of claim 1, wherein the process of repetitively phase shifting the second clock signal and sampling the first clock signal occurs until the second clock signal has been phase shifted by a determined number of the phase increments.

4. The method of claim 3 wherein the determined number of the phase increments is a multiple of an integer portion of a quotient yielded by dividing 360 by the phase increment or a multiple of a quotient yielded by dividing 360 by the phase increment.

5. The method of claim 1, wherein the process of repetitively phase shifting the second clock signal and sampling the first clock signal occurs until at least the sampling indicates that the first clock signal is at a logic zero state.

6. The method of claim 1, wherein a state machine is used to generate commands used in the phase shifting and the sampling.

7. The method of claim 1, wherein the sampling is done with a rising edge of the second clock signal.

8. The method of claim 1, comprising determining a duty cycle of the first clock signal by dividing the count of logic one samples by a number of phase increments in a period of the first clock cycle.

9. A system comprising:
a phase shifting circuitry configured to phase shift a second clock signal by a phase increment with respect to a first clock signal, wherein the first clock signal and the second clock signal have the same periods;
a sampling circuitry configured to sample the first clock signal with the second clock signal, wherein the output of the sampling circuitry indicates whether the sample of the first clock signal is at a logic one state or a logic zero state;
a counting circuitry that is configured to increment a count of logic one samples if the sample of the first clock signal is at a logic one state; and
a control circuitry configured to control at least the phase shifting circuitry and the sampling circuitry to repetitively perform the process of phase shifting the second clock signal and sampling the first clock signal.

10. The system of claim 9, wherein the second clock signal is derived from the first clock signal.

11. The system of claim 9, wherein the process of repetitively phase shifting the second clock signal and sampling the first clock signal occurs until the phase shifting circuitry has phase shifted the second clock signal by a determined number of the phase increments.

12. The system of claim 11, wherein the determined number of the phase increments is a multiple of an integer portion of a quotient yielded by dividing 360 by the phase increment or a multiple of a quotient yielded by dividing 360 by the phase increment.

13. The system of claim 9, wherein the process of repetitively phase shifting the second clock signal and sampling the first clock signal occurs until at least the sampling indicates that the first clock signal is at a logic zero state.

14. The system of claim 9, wherein the phase shifting circuitry is one of:
a phase locked loop and a digital delay locked loop.

15. The system of claim 9, wherein the sampling circuitry comprises an edge triggered flip-flop.

16. The system of claim 9, wherein the control circuitry is a state machine.

17. The system of claim 9, wherein the sampling is done with a rising edge of the second clock signal.

18. The system of claim 9, comprising a processor enabled to determine a duty cycle of the first clock signal by dividing the count of logic one samples by a number of phase increments in a period of the first clock cycle.

19. A method comprising:
adjusting a phase of a second clock signal by a phase increment with respect to a first clock signal, wherein the second clock signal is derived from the first clock signal and has the same period as the first clock signal;
sampling the first clock signal with the second clock signal;
determining whether a sample of the first clock signal is a logic one or a logic zero;
incrementing a counter if the sample is at a logic one state to update a count of logic one samples;
determining whether the phase of the second clock signal has been adjusted a maximum number of times; and
performing the process of adjusting the phase of the second clock signal and sampling the first clock signal if the phase of the second clock signal has not been adjusted by the phase increment a maximum number of times.

20. The method of claim 19, wherein the maximum number of times is a multiple of an integer portion of a quotient yielded by dividing 360 by the phase increment or a multiple of a quotient yielded by dividing 360 by the phase increment.

21. The method of claim 19, wherein the maximum number of times is reached when the sampling indicates that the first clock signal is at a logic zero state.

22. The method of claim 19, comprising determining a duty cycle of the first clock signal by dividing the count of the logic one samples by a number of phase increments in a period of the first clock cycle.

* * * * *